US012567846B2

(12) United States Patent
Son

(10) Patent No.: US 12,567,846 B2
(45) Date of Patent: Mar. 3, 2026

(54) ANALOG OUTPUT CIRCUIT AND INVERTER INCLUDING SAME

(71) Applicant: LS ELECTRIC CO., LTD., Anyang-si (KR)

(72) Inventor: Ju Beom Son, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 181 days.

(21) Appl. No.: 18/292,100

(22) PCT Filed: Sep. 7, 2022

(86) PCT No.: PCT/KR2022/013469
§ 371 (c)(1),
(2) Date: Jan. 25, 2024

(87) PCT Pub. No.: WO2023/113154
PCT Pub. Date: Jun. 22, 2023

(65) Prior Publication Data
US 2025/0096757 A1 Mar. 20, 2025

(30) Foreign Application Priority Data

Dec. 13, 2021 (KR) ........................ 10-2021-0177272

(51) Int. Cl.
*H03F 3/45* (2006.01)
*H02M 7/537* (2006.01)

(52) U.S. Cl.
CPC ........ *H03F 3/45475* (2013.01); *H02M 7/537* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 5,719,519 A * 2/1998 Berringer ........... H03K 17/0828
327/488
2002/0114115 A1 * 8/2002 Iwagami ........... H02M 7/53803
363/58
(Continued)

FOREIGN PATENT DOCUMENTS

JP 2000252770 A 9/2000
JP 2004214712 A 7/2004
(Continued)

OTHER PUBLICATIONS

International Search Report for related International Application No. PCT/KR2022/013469; action dated Jun. 22, 2023; (2 pages).
(Continued)

*Primary Examiner* — Crystal L Hammond
*Assistant Examiner* — Nusrat Quddus
(74) *Attorney, Agent, or Firm* — K&L Gates LLP

(57) ABSTRACT

The present disclosure relates to an analog output circuit and an inverter including the same. An analog output circuit according to an embodiment of the present invention is an analog output circuit of an electronic device, comprising an operational amplifier (Op-Amp) that amplifies the difference between a first input node connected to a line of an output voltage and a second input node connected to a line of an offset voltage, and outputs a bi-directional analog signal from an output node. The analog output circuit comprises: a first switch unit having one end connected to the first and second input nodes and the other end connected to the ground to switch between the one end and the other end; and a control unit that generates a control signal for controlling switching of the first switch unit.

8 Claims, 9 Drawing Sheets

(58) Field of Classification Search

CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02M 3/073; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/04; H02M 7/00; H05B 39/048; B23K 11/24; H04B 2215/069; H02H 7/261; H02H 7/268; H02J 3/36; H02J 3/01

See application file for complete search history.

(56) References Cited

U.S. PATENT DOCUMENTS

| | | | |
|---|---|---|---|
| 2009/0244056 A1* | 10/2009 | Tsuchi | G09G 3/3688 |
| | | | 330/252 |
| 2014/0176191 A1* | 6/2014 | Kim | H03M 1/1023 |
| | | | 327/50 |
| 2015/0236661 A1* | 8/2015 | Imai | H03F 3/45475 |
| | | | 330/260 |
| 2016/0105130 A1* | 4/2016 | Furuchi | H02P 6/085 |
| | | | 363/132 |
| 2018/0241357 A1 | 8/2018 | Shibata et al. | |
| 2022/0255543 A1* | 8/2022 | Shimada | H03K 5/24 |
| 2023/0308037 A1* | 9/2023 | Kobayashi | H02M 1/0025 |

FOREIGN PATENT DOCUMENTS

| | | | |
|---|---|---|---|
| JP | 2011229063 A | 11/2011 | |
| KR | 1019970055251 A | 7/1997 | |
| KR | 100765591 B1 | 10/2007 | |
| KR | 1020200008141 A | 1/2020 | |

OTHER PUBLICATIONS

Written Opinion for related International Application No. PCT/KR2022/013469; action dated Jun. 22, 2023; (4 pages).

* cited by examiner

ANALOG OUTPUT CIRCUIT AND INVERTER INCLUDING SAME

CROSS-REFERENCE TO RELATED APPLICATION

This application is a National Stage of International Application No. PCT/KR2022/013469, filed on Sep. 7, 2022, which claims priority to and the benefit of Korean Patent Application No. 10-2021-0177272, filed on Dec. 13, 2021, the disclosures of which is incorporated herein by reference in its entirety.

FIELD

The present disclosure relates to an analog output circuit and an inverter including the same, and more specifically to an analog output circuit which is implemented to prevent an abnormal output occurring in a transient state of power ON/OFF and an inverter including the same.

BACKGROUND

The inverter includes an analog output circuit having an analog output function. That is, in the inverter, the output frequency command of the inverter and the state values of various inverters are converted into analog signals and output through a terminal of an analog output circuit (hereinafter, referred to as an "analog output terminal"), and the analog output signals that are output from such an analog output terminal is transmitted to an upper controller or to an external device.

Meanwhile, the products of inverters (hereinafter, referred to as a "bi-directional output inverter") in which the output terminal of an analog output circuit (hereinafter, referred to as an "analog output terminal") outputs not a unidirectional signal in the range of 0 V (volt) to E V (volt) (where E is a real number greater than or equal to 1) (e.g., O V to 4 V), but a bi-directional signal in the range of –E1 V (volt) to E2 V (volt) (where E1 and E2 are real numbers greater than or equal to 1) (e.g., –4 V to 4 V) are being developed.

FIG. 1 shows an output circuit of a bi-directional output inverter.

As illustrated in FIG. 1, such a bi-directional output inverter includes an operational amplifier (Op-Amp) in an analog output circuit (hereinafter, referred to as the "first related art") for bi-directional output. In this case, the operational amplifier (Op-Amp) amplifies a unidirectional signal that is input to terminal A based on an offset signal of terminal B, and outputs the amplified bi-directional analog signal to terminal C (i.e., analog output terminal).

However, in the case of the first related art, while the analog output signal is output in the form of a bi-directional signal, it is amplified by the Op-Amp during a transient state of power ON or OFF (particularly, a transient state of OFF), and an abnormal output that is output from an analog output terminal (C) may occur, According to such an abnormal output, a signal of incorrect information is transmitted to an upper controller or external device connected to the analog output terminal (C), and accordingly, this can cause serious problems to the inverter system or external systems.

However, the above-described content merely provides background information on the present disclosure and does not correspond to previously disclosed technologies.

SUMMARY

In order to solve the problems of the related art as described above, an object of the present disclosure is to provide an analog output circuit technique for preventing the occurrence of an abnormal output during a transient state of power ON/OFF.

In addition, another object of the present disclosure is to provide an analog output circuit technique which is capable of preventing the occurrence of an abnormal output during a transient state of power ON/OFF more conveniently by using low-cost components.

However, the problems to be solved by the present disclosure are not limited to the above-mentioned problems, and other problems that are not mentioned will be clearly understood by those skilled in the art from the description below.

In order to solve the above-described problems, the analog output circuit according to an exemplary embodiment of the present disclosure is an analog output circuit of an electronic device that includes an operational amplifier (Op-Amp) that amplifies the difference between a first input node connected to a line of an output voltage and a second input node connected to a line of an offset voltage, and outputs a bi-directional analog signal in the range of –E1 V (volt) to E2 V (volt) (where E1 and E2 are real numbers greater than or equal to 1) from an output node, and the analog output circuit includes a first switch unit having one end connected to the first and second input nodes and the other end connected to the ground to switch between the one end and the other end; and a control unit that generates a control signal for controlling switching of the first switch unit.

When the first switch unit is in an OFF state, the output voltage and the offset voltage may respectively applied to first and second input nodes, and when the first switch unit is in an ON state, the first and second input nodes may operate to be in a ground state.

When the first switch is in an ON state, the first switch unit may be for unidirectional signal transmission in the range of 0 V to E V (where E is any real number greater than 0).

The control unit may generate the control signal when the power of a power supply unit of the electronic device is turned on and may not generate the control signal when the power of the power supply unit is turned off.

The first switch unit may be in an OFF state when the control signal is input, and the first switch unit may be in an ON state when the control signal is not input.

The operational amplifier may include a first power supply node supplied with a first power supply of positive (+) voltage and a second power supply node supplied with a second power supply of negative (–) voltage.

The analog output circuit according to an exemplary embodiment of the present disclosure may further includes a second switch unit which is connected to a line of the first power node and switches whether to supply the first power according to the control signal from the control unit; and a third switch unit which is connected to a line of the second power node and switches whether to supply the second power according to the control signal from the control unit.

The second and third switch units may be respectively implemented as photo couplers.

The control signal may act as an input to a light-emitting element of each photo coupler of the second and third switch units, wherein a light-receiving element of the photo coupler of the second switch unit may be connected to a line of the first power node, and wherein a light-receiving element of the photo coupler of the second switch unit may be connected to a line of the second power node.

When the control signal is input, the second and third switch units may operate to input the first and second power supplies to the operational amplifier, respectively, and when the control signal is not input, the second and third switch units may operate to cut off the first and second power supplies.

The electronic device may be an inverter.

The inverter according to an exemplary embodiment of the present disclosure is an inverter which includes an analog output circuit that outputs a bi-directional analog signal.

The analog output circuit may include an operational amplifier (Op-Amp) that amplifies the difference between a first input node connected to a line of an output voltage and a second input node connected to a line of an offset voltage, and outputs a bi-directional analog signal in the range of –E1 V (volt) to E2 V (volt) (where E1 and E2 are real numbers greater than or equal to 1) from an output node; a first switch unit having one end connected to the first and second input nodes and the other end connected to the ground to switch between the one end and the other end; and a control unit that generates a control signal for controlling switching of the first switch unit, wherein when the first switch unit is in an OFF state, the output voltage and the offset voltage may be respectively applied to first and second input nodes, and when the first switch unit is in an ON state, the first and second input nodes may operate to be in a ground state.

The present disclosure configured as described above has an advantage of preventing an abnormal output from occurring in the analog output circuit during a transient state of power ON/OFF.

In addition, the present disclosure has an advantage of being able to more conveniently and quickly prevent the occurrence of an abnormal output during a transient state of power ON/OFF by using low-cost components.

The effects that can be obtained in the present disclosure are not limited to the effects mentioned above, and other effects that are not mentioned will be clearly understood by those skilled in the art from the description below.

Figure 1:
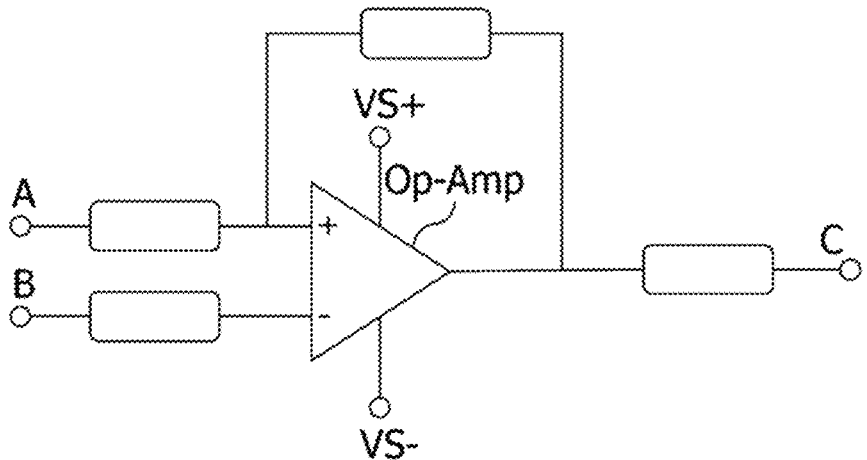
FIG. 1 shows an output circuit of a bi-directional output inverter.

| <Reference Numerals> |
| --- |
| 1: Inverter |
| 100: Analog output circuit |
| 110: Operational amplifier (Op-Amp) |
| 120: First switch unit |
| 130: Second switch unit |
| 140: Third switch unit |
| 150: Control unit |

DETAILED DESCRIPTION

The above objects and means of the present disclosure and effects thereof will become more apparent through the following detailed description in relation to the accompanying drawings, and accordingly, those of ordinary skill in art to which the present disclosure pertains may easily practice the technical spirit of the present disclosure. Additionally, in terms of describing the present disclosure, when it is determined that the detailed description of a known technology related to the present disclosure may unnecessarily obscure the gist of the present disclosure, the detailed description thereof will be omitted.

The terms used in the present specification are for describing exemplary embodiments and are not intended to limit the present disclosure. In the present specification, the singular form also includes the plural form in some cases unless specifically stated in the phrase. In the present specification, terms such as "comprise", "provide with", "include" or "have" do not exclude the presence or addition of one or more other constituent elements other than the mentioned constituent elements.

In the present specification, terms such as "or", "at least one" and the like may represent one of words listed together, or a combination of two or more. For example, "A or B" and "at least one of A and B" may include only one of A or B, and may include both A and B.

In the present specification, the description following "for example" may not exactly match the information presented, such as the recited characteristics, variables, or values, and the exemplary embodiments of the disclosure according to various examples of the present disclosure should not be limited to effects such as variations including tolerances, measurement errors, limitations of measurement accuracy and other commonly known factors.

In the present specification, when a component is described as being 'connected' or 'joined' to another component, it may be directly connected or joined to the other component, but it should be understood that other components may be present in the middle. On the other hand, when a component is referred to as being 'directly connected' or 'directly joined' to another component, it should be understood that there is no other component in the middle.

In the present specification, when a component is described as being 'on' or 'adjacent' of another component, it may be directly in contact with or connected to another component, but it should be understood that another component may be present in the middle. On the other hand, when a component is described as being 'directly above' or 'directly adjacent' of another component, it may be understood that another component does not exist in the middle. Other expressions describing the relationship between components, for example, 'between' and 'directly between' can be interpreted in this way.

In the present specification, terms such as 'first' and 'second' may be used to describe various components, but the corresponding components should not be limited by the above terms. In addition, the above terms should not be interpreted as limiting the order of each component, and may be used for the purpose of distinguishing one component from another component. For example, the 'first component' may be named as the 'second component', and similarly, the 'second component' may also be named as the 'first component.'

Unless otherwise defined, all terms used in the present specification may be used with meanings that can be commonly understood by those of ordinary skill in the art to which the present disclosure pertains. In addition, terms defined in a commonly used dictionary are not interpreted ideally or excessively unless explicitly defined specifically.

Hereinafter, a preferred exemplary embodiment according to the present disclosure will be described in detail with reference to the accompanying drawings.

Figure 2:
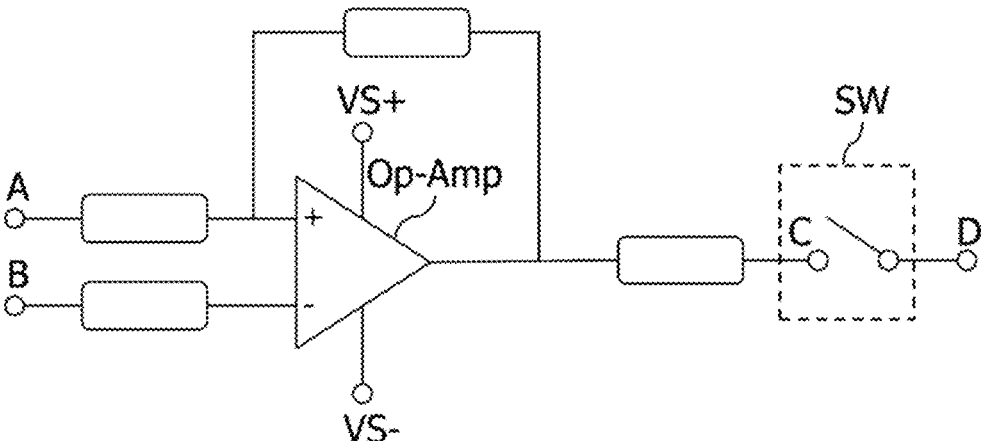
FIG. 2 shows an example of an analog output circuit of a bi-directional output inverter in which a means for preventing an abnormal output is implemented.

FIG. 2 shows an example of an analog output circuit of a bi-directional output inverter in which a means for preventing an abnormal output is implemented.

In order to solve the above-described problems of the first related art, as illustrated in FIG. 2, it is possible to propose the analog output circuit of an inverter which further includes a switch unit (SW) at terminal C of an operational amplifier Op-Amp (hereinafter, referred to as "the second related art"). In this second related art, the switch unit (SW) switches between terminal C and terminal D, and in this case, terminal D corresponds to an analog output terminal.

However, since the added switch unit (SW) needs to switch the analog output signals of bi-directional signals, it may be implemented only by using a fairly expensive switch, and accordingly, it causes a problem of increasing manufacturing cost. Additionally, in the second related art, the switch unit (SW) needs to handle a bi-directional signal whose operation range is considerably wide. Accordingly, since the voltage drop due to a contact resistance component of the switch unit (SW) in an ON state occurs considerably, the second related art has a problem in that calibration of the switch unit (SW) must be performed.

Figure 3:
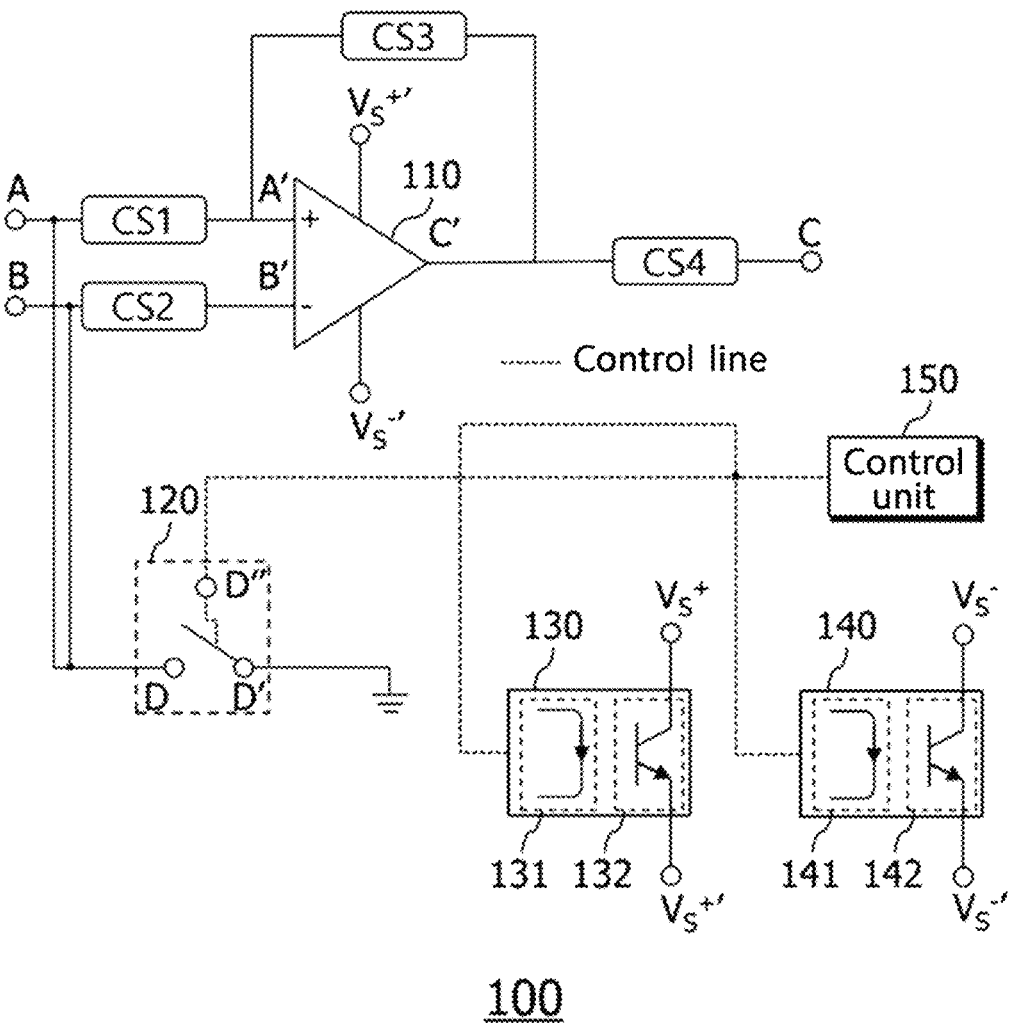
FIG. 3 shows an analog output circuit 100 according to an exemplary embodiment of the present disclosure.

FIG. 3 shows an analog output circuit 100 according to an exemplary embodiment of the present disclosure.

Accordingly, the present disclosure proposes a technique for simultaneously solving the above-described first and second related arts. That is, the present disclosure proposes an analog output circuit 100 which is capable of more conveniently preventing the occurrence of an abnormal output in a transient state of power ON/OFF by using low-cost components. In this case, the analog output circuit 100 is a circuit included in the electronic device, and it may have a function of generating various analog output signals that are associated with the operating state of the corresponding electronic device and outputting the same to an upper controller or an external device through an interface. For example, the electronic device to which the analog output circuit 100 is applied may include an inverter 1, and it may include other various home appliances and industrial controllers, but the present disclosure is not limited thereto.

Figure 4:
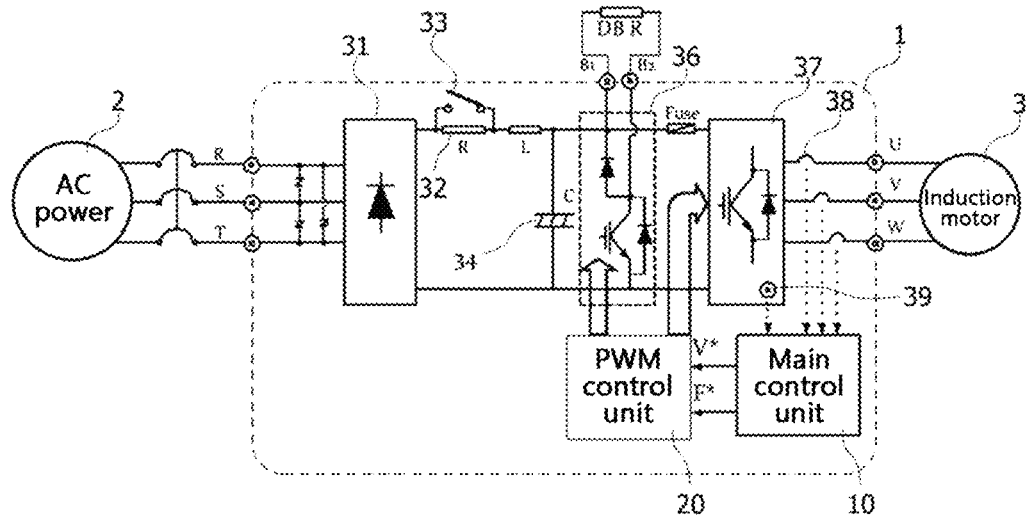
FIG. 4 shows the structure of an inverter 1 according to an exemplary embodiment of the present disclosure.

FIG. 4 shows the structure of an inverter 1 according to an exemplary embodiment of the present disclosure.

Meanwhile as illustrated in FIG. 4, the inverter 1 according to an exemplary embodiment of the present disclosure to which the analog output circuit 100 is applied receives power from an AC power source 2 such that the voltage and frequency required for driving control of an induction motor 3 may be varied and provided to the induction motor 3. In this case, the inverter 1 may realize its purpose through the PWM technique that generates a voltage by calculating a phase-voltage fundamental wave that can be output. Specifically, the inverter 1 may include a converter unit 31, an initial charging resistor 32, an initial charging switch 33, a DC link capacitor 34, a regenerative braking unit 36, an inverter unit 37, a current detection unit 38, a temperature detection unit 39, a main control unit 10, a pulse width modulation (PWM) control unit 20 and the like.

The converter unit 31 is a configuration that rectifies AC power and converts into DC. For example, the converter unit 31 may be generally composed of a diode, or may be composed of an SCR-diode form that is connected to a silicon controlled rectifier (SCR) of an initial charge switch 33.

The initial charge resistor 32 and the initial charge switch 33 are configurations for preventing an inrush current from being applied to the DC link capacitor 34 when power is applied. That is, when power is applied, the initial charge switch 33 is turned off, and the inrush current is suppressed by the initial charge resistor 32, and after the inrush current is suppressed, the initial charge switch 33 is turned on so as to separate the initial charging resistor 32 from the circuit. For example, the initial charge switch 33 may be composed of a magnetic contactor (MC), and may be composed of a silicon controlled rectifier (SCR) connected to a diode of an upper leg of the converter unit 31.

The DC link capacitor 34 may smooth the DC voltage rectified by the converter unit 31, and the inverter unit 37 may convert the DC voltage charged in the DC link capacitor 34 into an AC voltage. In this case, the inverter unit 37 may be composed of a plurality of control switching elements. For example, the control switching element may be composed of a transistor, a metal-oxide-semiconductor field-effect-transistor (MOSFET), an insulated gate bipolar transistor (IGBT) or a gate turn-off thyristor (GTO). The inverter unit 37 may output an AC voltage of magnitude and frequency modulated by PWM of variable frequency.

The regenerative braking unit 36 may consume regenerative energy through the resistor (DB R), when the increased DC voltage due to regenerative operation or the like is greater than a set voltage.

The current detection unit 38 may detect current flowing in each phase of U, V and W and provide the detected current to the main control unit 10. In addition, the temperature detection unit 39 may detect the temperature of the switching element of the inverter unit 37 and provide the detected temperature to the main control unit 10.

The main control unit 10 may collect various types of information such as the DC voltage and phase current of the inverter 1 and command various operations. The PWM control unit 20 generates a PWM waveform by using the voltage command (V*) and the frequency command (F*) that are input from the main control unit 10, and uses the same to apply a gate voltage to the switching element of each phase of the inverter unit 37 and the switch of the regenerative braking unit 36.

In the inverter 1 according to an exemplary embodiment of the present disclosure configured as described above, the main control unit 10 may receive a communication command including an operation command and a frequency command from an external upper controller (not illustrated), and it may be provided to the PWM control unit 20.

Meanwhile, although the main control unit 10 and the PWM control unit 20 are illustrated and described as being configured separately, they may be configured as one on one board. That is, it is also possible for the main control unit 10, which integrally performs the functions of the PWM control unit 20, to directly transmit a gate voltage to the inverter unit 37.

In particular, the inverter 1 may further include an analog output circuit 100 according to an exemplary embodiment of the present disclosure. Such an analog output circuit 100 may generate various analog output signals that are associated with the operating state of the inverter 1 and transmit the same to an upper controller or an external device through an interface. For example, the external device may be a programmable logic controller (PLC), a voltage meter or a current meter, but the present disclosure is not limited thereto.

The operation of such an analog output circuit 100 may be controlled by the main controller 10. In particular, since the inverter 1 is a bi-directional output inverter, the analog output circuit 100 may output an analog output signal having a bi-directional signal through an analog output terminal (C), and the corresponding analog output terminal (C) may be connected to the above-described interface.

Referring to FIG. 3, the analog output circuit 100 according to an exemplary embodiment of the present disclosure may include an operational amplifier (Op-Amp) 110, a first switch unit 120, a second switch unit 130, a third switch unit 140 and a control unit 150. In this case, the control unit 150 generates a control signal for the switching operation of each of the switch units 120, 130, 140 in the analog output circuit 100, and it may be the above-described main control unit 10 or may be separately implemented by an MCU including a memory.

The Op-Amp 110 includes a first power node supplied with a first power supply (VS+') of positive (+) voltage and a second power supply node supplied with a second power supply (VS−') of negative (−) voltage. That is, in the Op-Amp 110, two differential inputs are input to the first and second input nodes (A', B'), and by these first and second power supplies (VS+', VS−'), the difference between these differential inputs is amplified and output to an output node (C'). In this case, the differential inputs that are input to the first and second input nodes (A', B') may be unidirectional analog signals, and the signals that are output to the output node (C') may be bi-directional analog signals.

For example, the output voltage of a unidirectional analog signal of 0 V to E V (where E is a real number greater than 0) may be output from a first terminal (A), and the line of such a first terminal (A) may be connected to a first input node (A'). In this case, the unidirectional analog signal that is input to the first terminal (A) is a signal that is associated with the operating state of the inverter 1, and it may be a voltage that is output from the MCU of the main control unit 10. In particular, the circuit of CS1 may be provided between the first terminal (A) and the first input node (A'). Accordingly, the unidirectional analog signal applied to the first terminal (A) may be processed (modified) to be suitable for the Op-Amp 110 by CS1 and then input to the first input node (A').

In addition, a voltage having a positive value may be output from a second terminal (B), and a line of the second terminal (B) may be connected to the second input node (B'). In this case, the signal that is input to the second terminal (B) is a signal acting as a differential reference signal for the unidirectional analog signal of the first terminal (A), and it may be an offset voltage having a certain magnitude. In particular, the circuit of CS2 may be provided between the second terminal (B) and the first input node (B'). Accordingly, the signal applied to the second terminal (B) may be processed (modified) to be suitable for the Op-Amp 110 by CS2 and then input to the second input node (B').

The Op-Amp 110 amplifies the voltage difference between the signals that are respectively input to the first and second input nodes (A' and B') to output a bi-directional analog signal in the range of −E1 V (volt) to E2 V (volt) to the output node (C').

Figure 5:
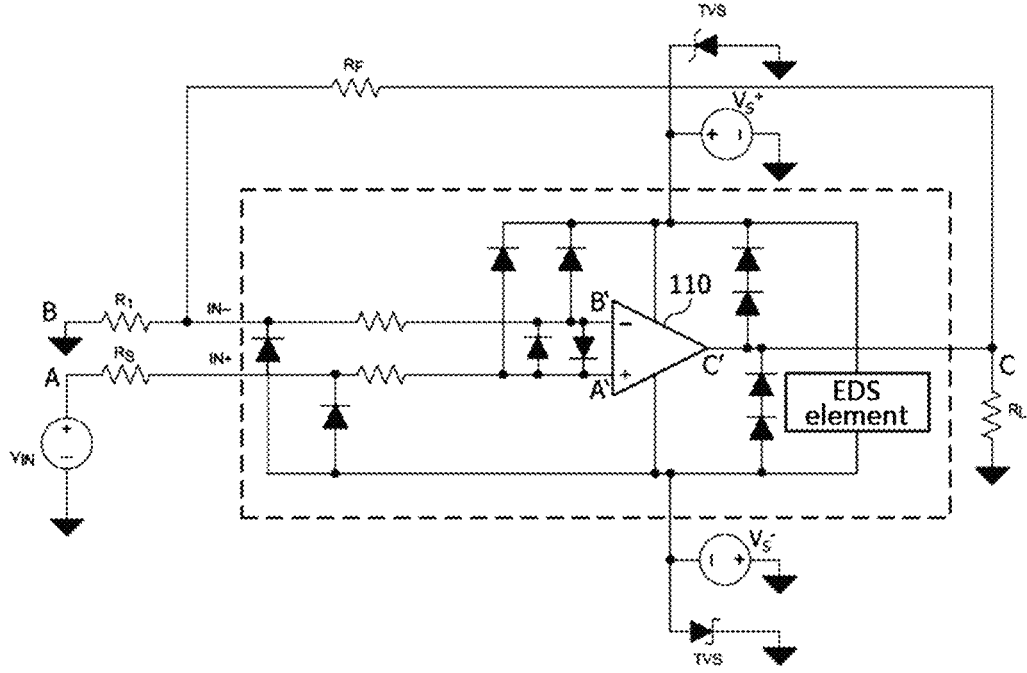
FIG. 5 shows an example of various circuits (CS1, CS2, CS3, CS4) connected around an Op-Amp 110.

FIG. 5 shows an example of various circuits (CS1, CS2, CS3, CS4) connected around an Op-Amp 110. However, in FIG. 5, the first switch unit 120 to the third switch unit 120, 130, 140 are not connected.

Referring to FIG. 5, various circuits (CS1, CS2, CS3, and CS4) for assisting the function of the Op-Amp 110 may be connected to the Op-Amp 110.

That is, as described above, CS1 and CS2 are circuits that are connected to resistance elements around the first and second input nodes (A', B') to affect the input signals, and may include diode elements and the like. In addition, CS3 is a circuit for feeding back the output of the output node (C') to the first input node (A') or the second input node (B'). Such CS3 may be connected between the output node (C') and the first input node (A') of the Op-Amp 110 or between the output node (C') and the second input node (B') of the Op-Amp 110, and it may include a resistance element, a diode element and the like. In addition, CS4 is a circuit connected to the periphery of the output node (C'). Such CS4 is connected between the output node (C') and the analog output terminal (C) of the Op-Amp 110, and it may affect the analog signal that is output from the output node (C') of the Op-Amp (110), it may include an ESD element for protecting electrostatic discharge (ESD) and the like.

In the first switch unit 120, one end (D) is connected to the first and second terminals (A, B), and the other end D' is connected to the ground, and it switches between one end (D) and the other end (D'). Certainly, one end (D) of the first switch unit 120 may be connected to the first and second input nodes (A', B'), respectively. For example, when the first switch unit 120 is in an OFF state, the output voltage and the offset voltage operate to be applied to the first and second input nodes (A', B'), respectively. In addition, when the first switch unit 120 is in an ON state, the first and second input nodes (A', B') operate to be in a ground state.

In this case, the control unit 150 may generate a control signal for controlling switching of the first switch unit 120 and transmit the same to the control terminal (D") of the first switch unit 120. In addition, the corresponding control signal may also be transmitted to the control terminals of the second and third switch units 130, 140.

Meanwhile, rather than operating in a method of generating each control signal for controlling an ON state and OFF state of the first to third switch units 120, 130, 140, the operation may be more preferable in the following manner. That is, when a specific control signal is generated by the control unit 150, the corresponding control signal is transmitted to the first to third switch units 120, 130, 140 such that the first switch unit 120 is in an OFF state and the second and third switch units 130, 140 are in an ON state, and when the control unit 150 does not generate a corresponding control signal (particularly, when the corresponding control signal is not naturally generated according to power OFF), the corresponding control signal is not transmitted to the first to third switch units 120, 130, 140 such that the first switch unit 120 may be in an ON state and the second and third switch units 130, 140 may be in an OFF state.

In this case, the control unit 150 may generate a control signal only when the power of a power supply unit (not illustrated) such as a switching mode power supply (SMPS) of the inverter 1 is supplied (i.e., turned ON), and when the power of the supply unit is cut off (i.e., turned OFF), the control signal is not generated naturally.

That is, when the power of the power supply unit is turned ON, the control unit 150 controls so as to generate a control signal, and thus, the first switch unit 120 is in an OFF state such that the resistance of the first and second input nodes (A', B') becomes almost infinite, and as a result, each differential input may be input as it is to the input nodes (A', B'), and accordingly, a bi-directional analog signal which is amplified by these differential inputs may be output from the output node (C').

On the other hand, when the power of the power supply unit is turned OFF, since the control signal by the control unit 150 is not naturally generated, the first switch unit 120 is in an ON state as a default state such that the first and second input nodes (A', B') become in a ground state, and accordingly, no signal is output to the output node (C').

In particular, the first switch unit 120 transmits an analog signal only in an ON state, and in this case, the corresponding analog signal has a unidirectional signal in the range of 0 V to E V. Accordingly, the first switch unit 120 may be implemented as a switch for transmitting a unidirectional analog signal in the range of 0 V to E V.

Figure 6:
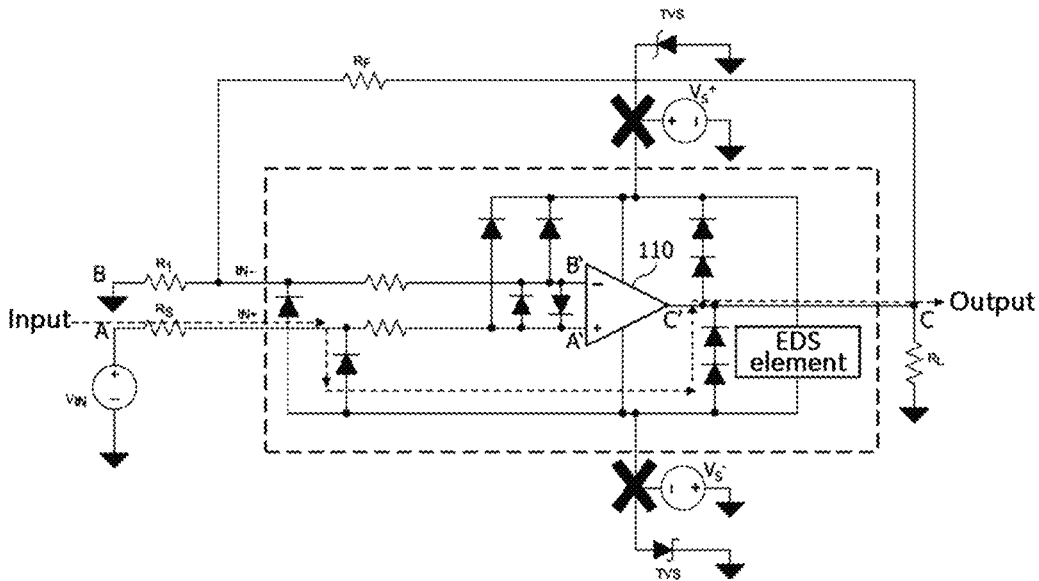
FIG. 6 shows a signal flow when power is turned off in FIG. 5. In this case, the signal flow is indicated by a red dotted line.

FIG. 6 shows a signal flow when power is turned off in FIG. 5. In this case, the signal flow is indicated by a red dotted line.

Referring to FIG. 6, even if the power is cut off during the transient state of power ON/OFF of the inverter 1, an offset output phenomenon may occur due to the 'self-powering' characteristic in which the analog signal from the output node (C') of the Op-Amp (110) is output as is through the ESD (Electro Static Discharge) element built into the Op-Amp (110). In order to improve this, as illustrated in FIG. 3, the present disclosure may prevent an offset from occurring through ON/OFF control of the first switch unit 120. That is, when an input signal which is input to the first and second input nodes (A' and B') of the Op-Amp 110 is generated during a transient state of power ON/OFF, the corresponding offset may be prevented by using the ON/OFF control signal for the first switch unit 120 to set the input signal to OV.

According to the present disclosure, by the operation of the first switch unit 120, the problems of the first related art may be improved such that an abnormal output such as offset output generated during a transient state of power ON/OFF may be prevented. In particular, since the first switch unit 120 may be implemented as a switch for transmitting a unidirectional analog signal corresponding to a very low-cost component, unlike the switch unit (SW) for transmitting a bi-directional analog signal of the second related art, it has an advantage that it is possible to reduce the manufacturing cost can be reduced.

Figure 7:
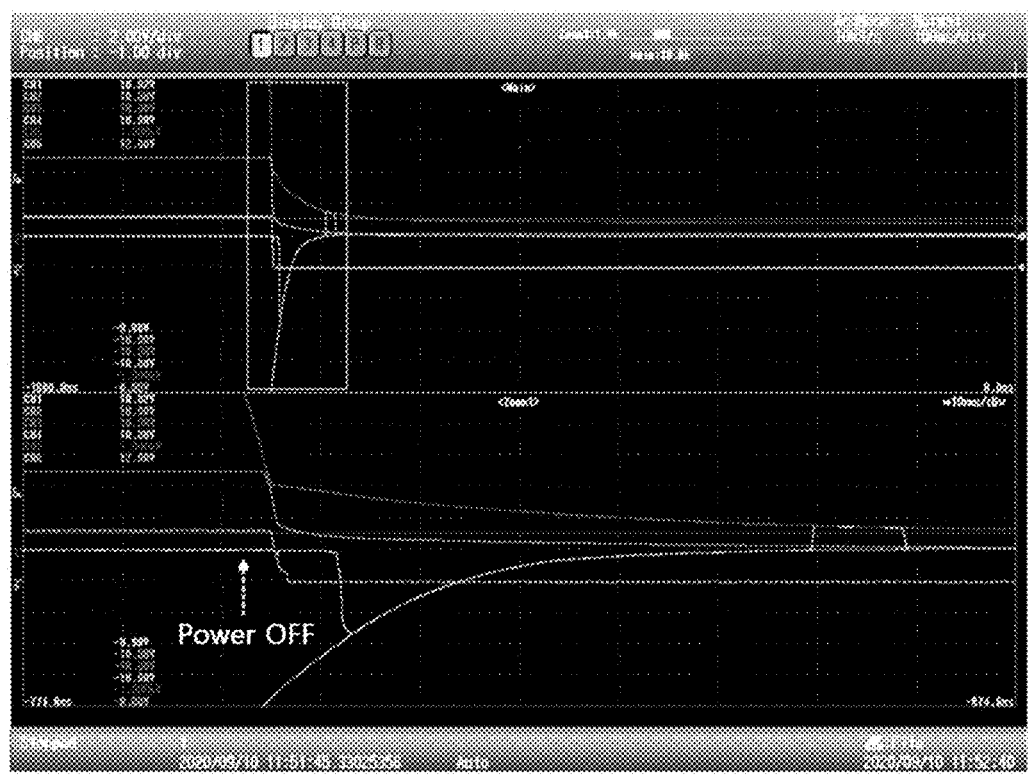
FIG. 7 shows a voltage diagram measured in a transient state of power OFF when the analog output circuit 100 includes only a first switch unit 120.
Figure 9:
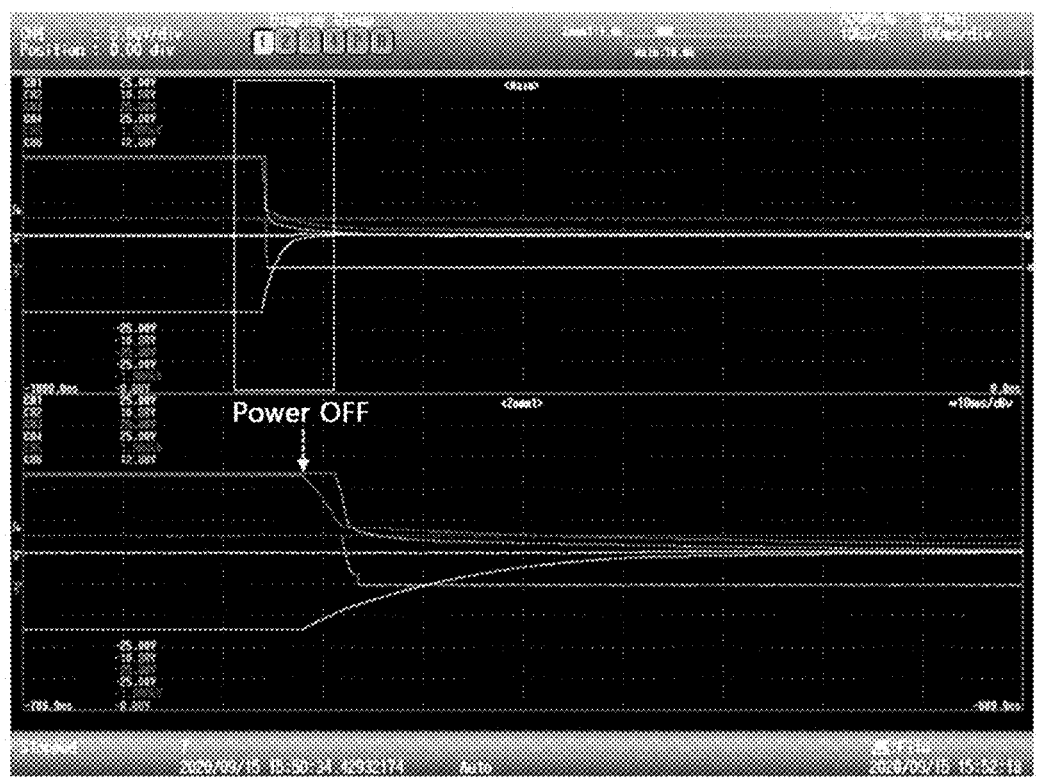
FIG. 9 shows a voltage diagram measured in a transient state of power OFF when the analog output circuit 100 includes all of the first to third switch units 120, 130, 140.

FIG. 7 shows a voltage diagram measured in a transient state of power OFF when the analog output circuit 100 includes only a first switch unit 120. On the other hand, FIG. 9 shows a voltage diagram measured in a transient state of power OFF when the analog output circuit 100 includes all of the first to third switch units 120, 130, 140. In FIGS. 7 and 9, the lower diagram is an enlarged part of the OFF transient state portion (rectangular box portion) of the upper diagram.

In FIGS. 7 and 9, CH3 represents the voltage of the first power node portion of the Op-Amp 110 supplied with power of VS+, CH4 represents the voltage of the second power node portion of the Op-Amp 110 supplied with power of VS−, and CH1 represents the voltage of the output node (C') portion of the Op-Amp 110, respectively.

Referring to FIG. 7, during a transient state of power ON/OFF (particularly, during an OFF transient state), each voltage slop varies depending on the load between the VS+ power and VS− power supplied to the first and second power nodes of the Op-Amp 110. Due to this power unbalancing problem between VS+ power and VS− power, an abnormal output may occur when the output of the output node (C') of the Op-Amp (110) reaches the limit voltage in one direction of the − direction or + direction.

Figure 8:
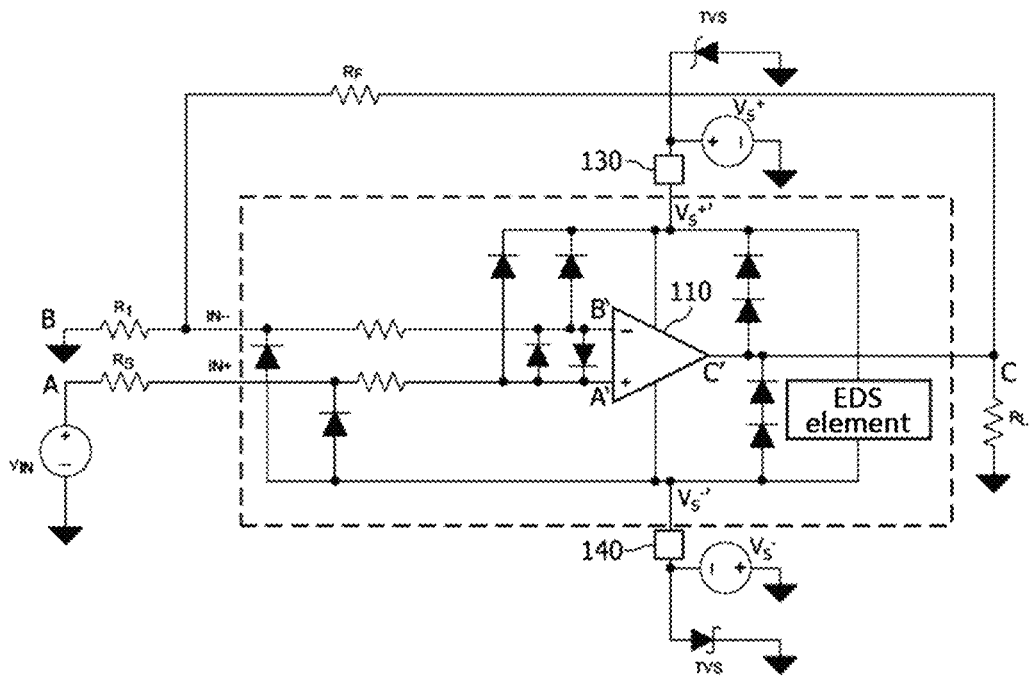
FIG. 8 shows a state in which the second and third switch units 130, 140 are additionally connected in FIG. 5.

FIG. 8 shows a state in which the second and third switch units 130, 140 are additionally connected in FIG. 5. However, in FIG. 8, the first switch unit 120 and the control unit 150 are omitted.

In order to improve this problem, as illustrated in FIGS. 3 and 8, the present disclosure may further include second and third switches 130, 140.

That is, the second switch unit 130 is connected to a line of the first power node of the Op-Amp 110 to which the first power (VS+') is supplied (i.e., a line to which VS+ is supplied) to switch whether to supply the first power (VS+') depending on the control signal of the control unit 150. Similarly, the third switch unit 140 is connected to a line of the second power node of the Op-Amp 110 to which the second power (VS−') is supplied (i.e., a line to which VS− is supplied) to switch whether to supply the second power (VS−') depending on the control signal of the control unit 150.

However, the second and third switch units 130, 140 must be implemented as elements to solve the problem of power supply unbalancing between the VS+ power and the VS− power. Accordingly, the second and third switch units 130, 140 may be implemented as photo couplers, which are elements that can reliably cut off the VS+ power and the VS− power when the power is turned off.

In this case, the photo couplers are transmission elements that transmit an input electrical signal and an output electrical signal through light. These photo couplers are packaged elements of a light-emitting element and a light-receiving element, and since they transmit a signal from the light-emitting element to the light-receiving element using light, the light-emitting element and the light-receiving element may be electrically insulated.

Specifically, the control signal of the control unit 150 acts as an input to the light-emitting elements 131, 141 of each photo coupler of the second and third switch units 130, 140. In addition, the light-receiving element 132 of the photo coupler of the second switch unit 130 is connected to a line of the first power node of the Op-Amp 110, and the light-receiving element 142 of the photo coupler of the second switch unit 150 is connected to a line of the second power node of the Op-Amp 110.

In this case, when the power of the power supply unit is turned ON, the control unit 150 controls to generate a control signal, and as this control signal is input, the second and third switch units 130, 140 are turned ON, and the first and second power supplies (VS+', VS−') may be input to the first and second power nodes of the op-amp 110, respectively. That is, when a control signal is generated in the control unit 150 according to power ON, the corresponding control signal is transmitted to each light-emitting element 131, 141 of the photo coupler of the second and third switch units 130, 140 such that a light signal is generated from each light-emitting elements 131, 141, respectively.

Accordingly, the light-receiving element 132 of the photo coupler of the second switch unit 130 receives the light signal of the light-emitting element 131 and connects (ON) between the terminal of VS+ and the first power node, and thus, the first power (VS+') may be applied to the first power node of the Op-Amp 110. At the same time, the light-receiving element 142 of the photo coupler of the third switch unit 140 receives the light signal of the light-emitting element 141 and connects (ON) between the terminal of VS− and the second power node, and thus, the second power (VS−') may be applied to the second power node of the Op-Amp (110).

On the other hand, when the power of the power supply unit is turned OFF, the control unit 150 naturally does not generate a control signal, and as the control signal is not transmitted, the second and third switch units 130, 140 are in the default OFF state such that the first and second power supplies (VS+', VS−') may be blocked from being input to the first and second power nodes of the Op-Amp 110, respectively. That is, since the control signal of the control unit 150 is not generated according to the power OFF, the light signal is not generated from each light-emitting element 131, 141 of the photo coupler of the second and third switch units 130, 140.

Accordingly, the light-receiving element 132 of the photo coupler of the second switch unit 130 blocks (OFF) between the terminal of VS+ and the first power node while not receiving the light signal, and accordingly, the input of first power (VS+') to the first node is cut off. At the same time, since the light-receiving element 142 of the photo coupler of the third switch unit 140 does not receive a light signal, it blocks (OFF) between the terminal of VS− and the second power node, and accordingly, the input of the second power (VS−') to the second power node is blocked.

As the second and third switch units 130, 140 are respectively implemented as photo couplers, the following advantages are achieved. 1) The input/output is completely electrically insulated, and the blocking effect of the first and second power supplies (VS+', VS−') when the power is turned OFF is great. 2) Since the signal transmission is unidirectional, there is no effect on the input from the output. 3) The response speed is very fast, and the mounting density may be increased because it is small and light. 4) It has semi-permanent life and high reliability, and is strong against noise because it transmits signals by using light.

In particular, as illustrated in FIG. 9, since the second and third switch units 130, 140 are implemented as photo couplers, respectively, the first and second power supplies (VS+', VS−') which are respectively supplied to the first and second power nodes of the Op-Amp 110 may cut off more quickly and accurately by the ON/OFF operation of the corresponding photo coupler during the transient state of power ON/OFF of the power supply unit (particularly, during the OFF transient state), and accordingly, the above-described power supply unbalancing problem may be solved.

The present disclosure configured as described above can prevent the occurrence of an abnormal output in the analog output circuit during the transient state of power ON/OFF, and particularly, it has an advantage of being able to prevent the occurrence of an abnormal output more conveniently and quickly by using low-cost components.

In the detailed description of the present disclosure, specific exemplary embodiments have been described, but various modifications are possible without departing from the scope of the present disclosure. Therefore, the scope of the present disclosure is not limited to the described exemplary embodiments, and should be defined by the following claims and equivalents thereof.

The present disclosure relates to an analog output circuit and an inverter having the same, and since it is possible to provide an analog output circuit which is implemented to prevent an abnormal output occurring in a transient state of power ON/OFF and an inverter including the same, it has industrial applicability.

The invention claimed is:

1. An analog output circuit which is an analog output circuit of an electronic device that comprises an operational amplifier (Op-Amp) that amplifies a difference between a first input node connected to a line of an output voltage and a second input node connected to a line of an offset voltage, and outputs a bi-directional analog signal from an output node, the analog output circuit comprising:

a first switch unit having one end connected to the first and second input nodes and the other end connected to the ground to switch between the one end and the other end; and a control unit that generates a control signal for controlling switching of the first switch unit, wherein when the first switch unit is in an OFF state, the output voltage and the offset voltage are respectively applied to first and second input nodes, and when the first switch unit is in an ON state, the first and second input nodes operate to be in a ground state, wherein the control unit generates the control signal when power of a power supply unit of the electronic device is turned on and does not generate the control signal when the power of the power supply unit is turned off, and wherein the first switch unit is in an OFF state when the control signal is input, and the first switch unit is in an ON state when the control signal is not input.

2. The analog output circuit of claim 1, wherein when the first switch is in an ON state, the first switch unit is for unidirectional signal transmission.

3. The analog output circuit of claim 1, wherein the operational amplifier comprises a first power supply node supplied with a first power supply of positive (+) voltage and a second power supply node supplied with a second power supply of negative (−) voltage, and the analog output circuit further comprises:

a second switch unit which is connected to a line of the first power node and switches whether to supply the first power according to the control signal from the control unit; and a third switch unit which is connected to a line of the second power node and switches whether to supply the second power according to the control signal from the control unit.

4. The analog output circuit of claim 3, wherein the second and third switch units are respectively implemented as photo couplers.

5. The analog output circuit of claim 4, wherein the control signal acts as an input to a light-emitting element of each photo coupler of the second and third switch units, wherein a light-receiving element of the photo coupler of the second switch unit is connected to a line of the first power node, and wherein a light-receiving element of the photo coupler of the second switch unit is connected to a line of the second power node.

6. The analog output circuit of claim 5, wherein the control unit generates the control signal when the power of the power supply unit of the electronic device is turned on and does not generate the control signal when the power of the power supply unit is turned off, wherein when the control signal is input, the second and third switch units operate to input the first and second power supplies to the operational amplifier, respectively, and wherein when the control signal is not input, the second and third switch units operate to cut off the first and second power supplies.

7. The analog output circuit of claim 1, wherein the electronic device is an inverter.

8. An inverter which is an inverter that comprises an analog output circuit that outputs a bi-directional analog signal, the analog output circuit comprising:

an operational amplifier (Op-Amp) that amplifies the difference between a first input node connected to a line of an output voltage and a second input node connected to a line of an offset voltage, and outputs a bi-directional analog signal from an output node;

a first switch unit having one end connected to the first and second input nodes and the other end connected to the ground to switch between the one end and the other end; and a control unit that generates a control signal for controlling switching of the first switch unit, wherein when the first switch unit is in an OFF state, the output voltage and the offset voltage are respectively applied to first and second input nodes, and when the first switch unit is in an ON state, the first and second input nodes operate to be in a ground state.

* * * * *